(12) United States Patent
Miller et al.

(10) Patent No.: US 8,581,610 B2
(45) Date of Patent: Nov. 12, 2013

(54) METHOD OF DESIGNING AN APPLICATION SPECIFIC PROBE CARD TEST SYSTEM

(76) Inventors: Charles A Miller, Fremont, CA (US); Matthew E Chraft, Copperopolis, CA (US); Roy J Henson, Pleasanton, CA (US)

( * ) Notice: Subject to any disclaimer, the term of this patent is extended or adjusted under 35 U.S.C. 154(b) by 361 days.

(21) Appl. No.: 11/452,784

(22) Filed: Jun. 13, 2006

(65) Prior Publication Data

US 2006/0273809 A1    Dec. 7, 2006

Related U.S. Application Data

(63) Continuation-in-part of application No. 10/828,755, filed on Apr. 21, 2004, now Pat. No. 7,307,433.

(51) Int. Cl.
*G01R 31/20* (2006.01)

(52) U.S. Cl.
USPC ............... 324/754.01; 324/500; 324/755.01; 324/756.03; 324/762.03; 716/136

(58) Field of Classification Search
USPC ............. 716/4–6, 136; 714/724–728, 46; 324/500, 754, 755, 754.01–754.11, 324/755.01–755.11, 756.03, 324/762.01–762.03; 702/117
See application file for complete search history.

(56) References Cited

U.S. PATENT DOCUMENTS

| | | | |
|---|---|---|---|
| 3,848,188 A * | 11/1974 | Ardezzone et al. ........... 714/744 |
| 5,363,038 A | 11/1994 | Love | |
| 5,491,427 A | 2/1996 | Ueno et al. .................... 324/754 |
| 5,497,079 A | 3/1996 | Yamada et al. | |
| 5,736,850 A * | 4/1998 | Legal .......................... 324/158.1 |
| 6,064,213 A | 5/2000 | Khandros et al. | |
| 6,145,384 A * | 11/2000 | Ikeda et al. ..................... 73/780 |
| 6,184,053 B1 | 2/2001 | Eldridge et al. | |
| 6,275,051 B1 | 8/2001 | Bachelder et al. | |
| 6,400,173 B1 | 6/2002 | Shimizu et al. ............... 324/765 |
| 6,429,029 B1 | 8/2002 | Eldridge et al. ............... 438/14 |

(Continued)

FOREIGN PATENT DOCUMENTS

| | | |
|---|---|---|
| JP | 08-037215 | 2/1996 |
| JP | 08-129053 | 5/1996 |
| WO | WO 2005/103740 | 11/2005 |

OTHER PUBLICATIONS

U.S. Appl. No. 10/693,133, filed Oct. 23, 2003, Charles A. Miller.

(Continued)

*Primary Examiner* — Nha Nguyen
(74) *Attorney, Agent, or Firm* — Kirton McConkie

(57) ABSTRACT

A method is provided for design and programming of a probe card with an on-board programmable controller in a wafer test system. Consideration of introduction of the programmable controller is included in a CAD wafer layout and probe card design process. The CAD design is further loaded into the programmable controller, such as an FPGA to program it: (1) to control direction of signals to particular ICs, even during the test process (2) to generate test vector signals to provide to the ICs, and (3) to receive test signals and process test results from the received signals. In some embodiments, burn-in only testing is provided to limit test system circuitry needed so that with a programmable controller on the probe card, text equipment external to the probe card can be eliminated or significantly reduced from conventional test equipment.

12 Claims, 10 Drawing Sheets

(56) References Cited

U.S. PATENT DOCUMENTS

| | | | |
|---|---|---|---|
| 6,434,503 B1 * | 8/2002 | Sommer | 702/123 |
| 6,499,121 B1 * | 12/2002 | Roy et al. | 714/724 |
| 6,500,257 B1 | 12/2002 | Wang et al. | |
| 6,525,555 B1 | 2/2003 | Khandros et al. | |
| 6,526,557 B1 * | 2/2003 | Young et al. | 716/16 |
| 6,539,531 B2 | 3/2003 | Miller et al. | 716/15 |
| 6,551,844 B1 | 4/2003 | Eldridge et al. | 438/14 |
| 6,603,323 B1 | 8/2003 | Miller et al. | 324/754 |
| 6,615,485 B2 | 9/2003 | Eldridge et al. | 29/843 |
| 6,624,648 B2 | 9/2003 | Eldridge et al. | 324/761 |
| 6,701,474 B2 * | 3/2004 | Cooke et al. | 714/724 |
| 6,727,580 B1 | 4/2004 | Eldridge et al. | |
| 6,747,473 B2 * | 6/2004 | Cowan | 324/765 |
| 6,788,094 B2 | 9/2004 | Khandros et al. | |
| 6,791,344 B2 * | 9/2004 | Cook et al. | 324/754 |
| 6,810,514 B1 * | 10/2004 | Alfke et al. | 716/16 |
| 6,838,893 B2 | 1/2005 | Khandros, Jr. et al. | 324/754 |
| 6,856,150 B2 | 2/2005 | Sporck et al. | |
| 7,078,926 B2 | 7/2006 | Khandros et al. | |
| 7,116,119 B2 | 10/2006 | Sporck et al. | |
| 7,173,444 B2 * | 2/2007 | Pourkeramati et al. | 324/765 |
| 7,245,134 B2 | 7/2007 | Granicher et al. | |
| 7,307,433 B2 | 12/2007 | Miller et al. | |
| 7,345,493 B2 | 3/2008 | Khandros et al. | |
| 2002/0091979 A1 * | 7/2002 | Cooke et al. | 714/733 |
| 2002/0171449 A1 * | 11/2002 | Shimizu et al. | 324/765 |
| 2003/0076125 A1 * | 4/2003 | McCord | 324/765 |
| 2003/0151421 A1 * | 8/2003 | Leedy | 324/760 |
| 2004/0059971 A1 * | 3/2004 | Cowan | 714/724 |
| 2004/0113655 A1 * | 6/2004 | Curd et al. | 326/40 |
| 2004/0162715 A1 * | 8/2004 | Frank et al. | 703/14 |
| 2004/0198081 A1 | 10/2004 | Eldridge et al. | |
| 2005/0285614 A1 * | 12/2005 | Ma | 324/765 |
| 2007/0261009 A1 | 11/2007 | Granicher et al. | |
| 2008/0100320 A1 | 5/2008 | Miller et al. | |

OTHER PUBLICATIONS

U.S. Appl. No. 10/828,755, filed Apr. 21, 2004, Miller, et al.
U.S. Appl. No. 11/872,751, filed Sep. 27, 2007, Berry.
U.S. Appl. No. 11/861,223, filed Sep. 25, 2007, Berry.
U.S. Appl. No. 12/046,009, filed Mar. 11, 2008, Kemmerling.
U.S. Appl. No. 12/044,600, filled Mar. 7, 2008, Kemmerling.
U.S. Appl. No. 11/960,396, filed Dec. 19, 2007, Kemmerling.
U.S. Appl. No. 12/050,857, filed Mar. 18, 2008, Khandros et al.
U.S. Appl. No. 12/239,326, filed Sep. 26, 2008, Kemmerling.
Search Report and Written Opinion of the International Searching Authority, PCT application PCT/US07/69810 (Dec. 24, 2008), 15 pages.
Int'l Preliminary Report on Patentability, PCT application PCT/US/2007/069810 (Jan. 29, 2009), 12 pages.

* cited by examiner

METHOD OF DESIGNING AN APPLICATION SPECIFIC PROBE CARD TEST SYSTEM

CROSS-REFERENCE TO RELATED APPLICATION

The present application is a continuation-in-part of application Ser. No. 10/828,755, filed Apr. 21, 2004, entitled "Intelligent Probe Card Architecture," by Miller, et al., which is incorporated by reference herein in its entirety.

BACKGROUND

1. Technical Field

Embodiments of the present invention relate to programming of test systems with probe cards. More particularly, embodiments of the present invention relate to probe cards with on board features used to test integrated circuits (ICs) on a wafer.

2. Related Art

A wafer testing device typically includes a probe card with probes for electrically contacting pads of ICs on the wafer. The location of the IC contact pads on a wafer, as well as the signals that need to be sent for testing are different for each IC design. In the test system, the length of test lines and components on the probe card should also be considered to best interpret test results. Cost considerations for the test equipment are also important, so designers typically attempt to make only test signal software changes and changes to the probe cards to accommodate different wafer layouts, since replacement of the main test system controller components and operating software are significantly more expensive. Conventional steps to design and program a test system to accommodate different IC configurations on a wafer are considered to follow.

I. IC Design and Wafer Layout Process

Consideration of the wafer layout process, including what IC components are included and how ICs are placed on the wafer defines boundaries for a test system. The test system probe locations for contacting pads on the ICs and signals provided on lines delivering signals to the probes are determined based on the IC wafer layout. One process for layout of ICs on a wafer is described in U.S. Pat. No. 6,539,531, entitled "Method of Designing, Fabricating, Testing and Interconnecting an IC to External Circuit Nodes" to Miller, et al., issued Mar. 25, 2003.

FIG. 1 illustrates a typical prior art process of designing and fabricating an IC on a wafer. A design engineer initially develops a design specification (70) abstractly describing the overall architecture of the IC and then develops a high-level hardware description language (HDL) model of the IC (72). The design engineer also programs a circuit simulator (74) to simulate circuit behavior based on the HDL circuit model.

Thereafter, the design engineer usually employs computer-aided logic synthesis tools (76) to convert the high-level HDL circuit model into a technology-specific, behavioral model of the circuit such as a netlist. A netlist model typically describes the behavior of circuit components based on models provided by a cell library (80). Each cell of cell library (80) includes both netlist-level behavioral models and structural models (mask layouts) for each circuit component that may be incorporated into an IC. Cell library (80) may include cells describing low level circuit components such as individual resistors and transistors as well as higher level standard circuit components such as logic gates, memories and central processing units.

During the iterative, synthesis process the design engineer uses a simulator and other tools to verify circuit operation based on the netlist model (82) and may iteratively adjust the HDL model to produce a netlist model that satisfies various constraints.

Having verified the logic and timing of the netlist circuit model, the design engineer employs additional computer-aided design tools to establish a floorplan (78) fixing locations of the IC's input/output (I/O). Placement and routing tools establish the detailed layout of the various layers of IC, outlining how the conductors interconnecting those cells are to be routed (86). In addition to a behavioral model of a circuit component, each component cell of cell library (84) also includes a structural model (mask layout) of the circuit component that can be incorporated into the IC layout. The computer aided design (CAD) tools vary the IC design, subjecting each variation to simulation and verification (88) to determine how well it satisfies the specification. The floorplan output is a structural model of the IC in the form of a set of masks telling an IC manufacturer how to fabricate the various layers of the IC.

II. Test System Design and Fabrication

Once the IC design for a wafer is complete, the layout of pads and the pin functions of the pads are used to construct and program a test system to test components on the wafer during fabrication. To minimize costs, a replaceable probe card is typically constructed as an interface between a test system controller and the wafer since cost for structural modifications to a test system controller are significantly higher.

The probe card includes probes and internal channel routing lines to link the probes to connectors linking to the test system controller. Components such as switches and capacitors may be included in the channel paths. Placement and routing of channels is performed prior to creation of masks for fabricating layers of the probe card. Once the design is complete, probe cards can be created and fabricated using a number of methods to create micro-electro-mechanical systems (MEMs) with probe elements, the probes including, for example, lithographic spring contacts, wire bonds, needle probes and cobra probes. The test system controller can then be programmed to generate appropriate test signals to provide through the channels of the probe card, and to analyze signals received to interpret test results.

For reference, FIG. 2 shows a block diagram of a typical test system using a probe card for testing devices under test (DUTs) on a semiconductor wafer. The test system includes a test system controller 4, which may be an Automatic Test Equipment (ATE) tester or general purpose computer, connected by a communication cable 6 to a test head 8. The test system further includes a prober 10 made up of a stage 12 for mounting a wafer 14 being tested, the stage 12 being movable to contact the wafer 14 with probes 16 on a probe card 18. The prober 10 includes the probe card 18 supporting probes 16 which contact DUTs formed on the wafer 14.

In the test system, test signals are generated by the test system controller 4 and transmitted through the communication cable 6, test head 8, probe card 18, probes 16 and ultimately to DUTs on the wafer 14. Test data provided from the test system controller 4 is divided into the individual test channels provided through the cable 6 and separated in the test head 8 so that each channel is carried to a separate one of the probes 16. The channels from the test head 8 are linked by flexible cable connectors 24 to the probe card 18. The probe card 18 then links each channel to a separate one of the probes 16. Test results are then provided from DUTs on the wafer back through the probe card 18 to the test head 8 for transmission back to the test system controller 4. Once testing is complete, the wafer is diced up to separate the DUTs.

FIG. 3 shows a cross sectional view of components of a typical probe card 18. The probe card 18 is configured to provide both electrical pathways and mechanical support for the spring probes 16 that will directly contact the wafer. The probe card electrical pathways are provided through a printed circuit board (PCB) 30, an interposer 32, and a space transformer 34. Test data from the test head 8 is provided through flexible cable connectors 24 typically connected around the periphery of the PCB 30. Channel transmission lines 40 distribute signals from the connectors 24 horizontally in the PCB 30 to contact pads on the PCB 30 to match the routing pitch of pads on the space transformer 34. The interposer 32 includes a substrate 42 with spring probe electrical contacts 44 disposed on both sides. The interposer 32 electrically connects individual pads on the PCB 30 to pads forming a land grid array (LGA) on the space transformer 34. Traces 46 in a substrate 45 of the space transformer 34 distribute or "space transform" connections from the LGA to spring probes 16 configured in an array.

Mechanical support for the electrical components is provided by a back plate 50, bracket (Probe Head Bracket) 52, frame (Probe Head Stiffener Frame) 54, leaf springs 56, and leveling pins 62. The back plate 50 is provided on one side of the PCB 30, while the bracket 52 is provided on the other side and attached by screws 59. The leaf springs 56 are attached by screws 58 to the bracket 52. The leaf springs 56 extend to movably hold the frame 54 within the interior walls of the bracket 52. The frame 54 then includes horizontal extensions 60 for supporting the space transformer 34 within its interior walls. The frame 54 surrounds the probe head and maintains a close tolerance to the bracket 52 such that lateral motion is limited.

Leveling pins 62 complete the mechanical support for the electrical elements and provide for leveling of the space transformer 34. The leveling pins 62 are adjusted so that brass spheres 66 provide a point contact with the space transformer 34. The spheres 66 contact outside the periphery of the LGA of the space transformer 34 to maintain isolation from electrical components. Leveling of the substrate is accomplished by precise adjustment of these spheres through the use of advancing screws, or leveling pins 62. The leveling pins 62 are screwed through supports 65 in the back plate 50 and PCB 30. Motion of the leveling pin screws 62 is opposed by leaf springs 56 so that spheres 66 are kept in contact with the space transformer 34. FIG. 4 shows an exploded assembly view of components of the probe card of FIG. 3. FIG. 5 shows a perspective view of the opposing side of PCB 30 from FIG. 4, illustrating the arrangement of connectors 24 around its periphery.

Alternative embodiments of probe card assemblies are described in U.S. Pat. No. 6,624,648, entitled "Probe Card Assembly" to Eldridge, et al., issued Sep. 23, 2003, U.S. Pat. No. 6,615,485, entitled "Probe Card Assembly and Kit and Methods of Making Same" to Eldridge, et al., issued Sep. 9, 2003, U.S. Pat. No. 6,838,893, entitled "Probe Card Assembly" to Khandros, Jr., et al., issued Jan. 4, 2005, and U.S. Pat. No. 6,856,150, entitled "Probe Card With Coplanar Daughter Card" to Sporck, et al., issued Feb. 15, 2005.

III. Wafer Testing

Test systems are typically used in one instance to test memory components, such as dynamic random access memory (DRAM) on a wafer during manufacture while ICs are still in the form of a die on the wafer before the wafer is diced up into individual chips. "Repairable" DRAMs typically have one or more "spare" rows or columns of memory cells that can replace a row or column with defective cells. Wafer testing can include a "redundancy analysis" to determine how to best allocate spare rows or columns to replace the rows or columns containing defective cells. The memory is then repaired using lasers or other means to appropriately alter signal path routing within the IC so that spare rows and/or columns of cells are substituted for rows and columns having defective cells.

When the IC has no repairable memory, the wafer is "diced" to separate the individual die and packaged. The packaged IC may be subjected to a "burn-in" process wherein it is heated in an oven to place it under the kind of heat and voltage stress that it may encounter in its working environment.

A limitation of a typical test system controller with increased density of DUTs on a wafer is that not all DUTs can be tested during a single touch down of a probe card. With advancing technology, more DUTs are fabricated on a single wafer. To avoid the cost of a new test system controller, multiple touchdowns of a test system to the wafer are performed. Multiple touch downs, however, may be undesirable since touchdowns increase the likelihood of damaging the wafer, and touch downs further increase wear on the probes in the test system, which may be expensive to replace.

SUMMARY

In accordance with some embodiments of the present invention, a method is provided to design and program a probe card with one or more intelligent on board features. On board features of the probe card can include at least one or more of the following: (a) a control component such as a microcontroller, processor, or FPGA included on the probe card; (b) stacked or vertically oriented daughter cards provided between test system controller connections which form an outline area on the PCB of the probe card, the stacked daughter cards to accommodate test circuit components; (c) test functions provided using the on board microcontroller or FPGA and associated multiplexers and D/A converters; and (d) use of a communications bus between a microcontroller or FPGA provided on the probe card and the test system controller.

In some embodiments of the present invention, a test system can be configured to perform burn-in testing of ICs on a wafer before it is diced up. Burn-in test components can be provided directly on the probe card, or on one or more stacked daughter cards attached to a main probe card.

In still further embodiments, only burn-in testing can be performed to limit the test system components needed, possibly eliminating the need for a complex ATE type test system controller. Test circuitry can be provided on the probe card, along with an external power supply and a personal computer to interface with the test circuitry to eliminate the need for the ATE type tester.

In some embodiments, simplified probe cards can be added to a frame or cassettes, with all probe cards in the frame controlled using a single personal computer or host controller.

BRIEF DESCRIPTION OF THE DRAWINGS

Further details of embodiments of the present invention are explained with the help of the attached drawings in which.

DETAILED DESCRIPTION

I. Probe Card with On-Board Intelligent Circuitry

Figure 3:
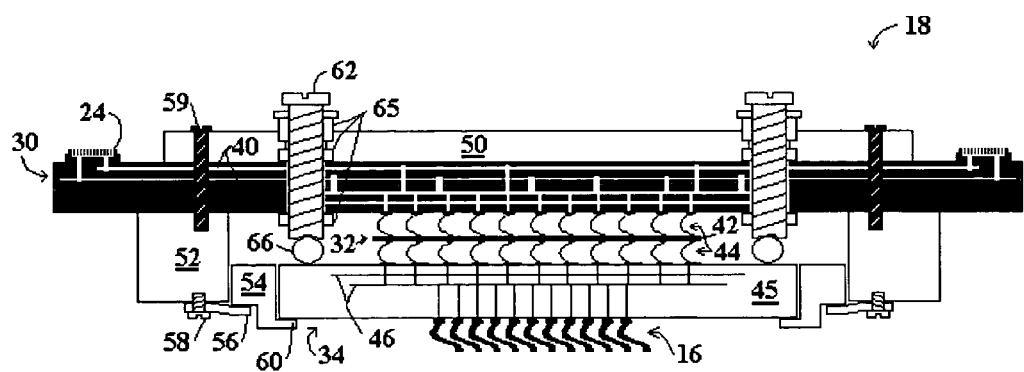
FIG. 3 shows a cross sectional view of a components of a typical probe card.
Figure 4:
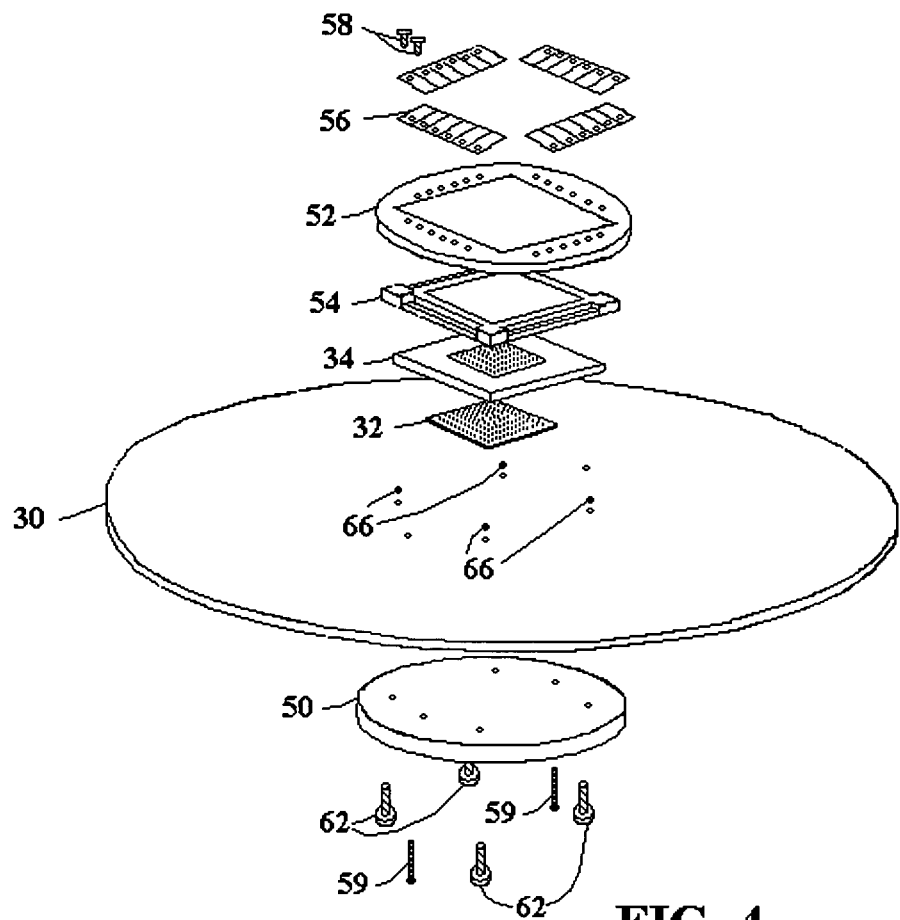
FIG. 4 shows an exploded assembly view of components of the probe card of FIG. 3.
Figure 5:
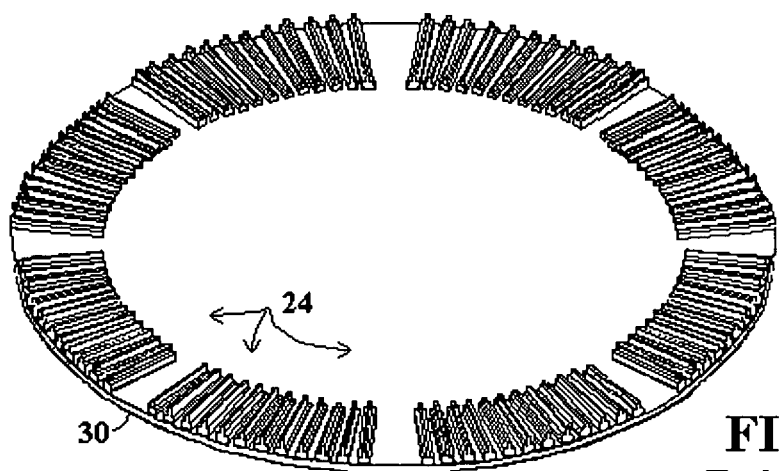
FIG. 5 shows a perspective view of the opposing side of PCB from FIG. 4.
Figure 6:
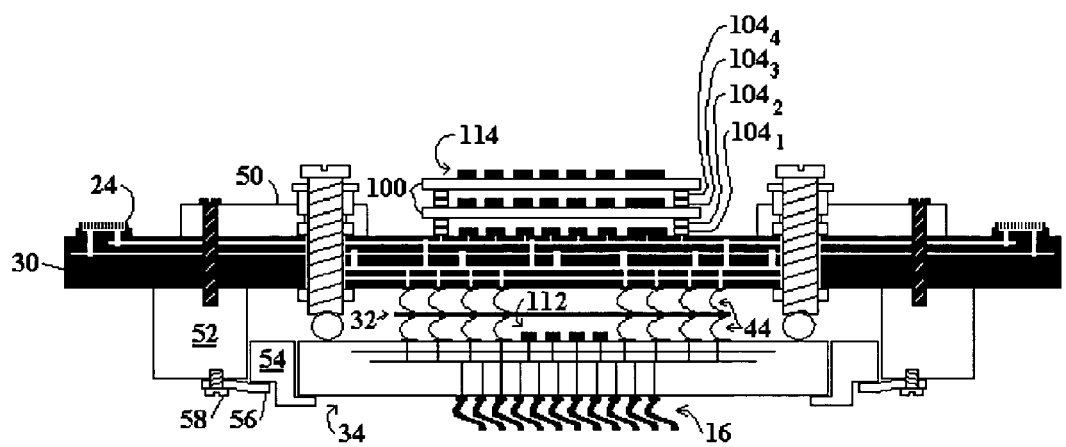
FIG. 6 shows a cross sectional view of a probe card, modified from the probe card configuration shown in FIG. 3 to include on board components that can be programmed to perform testing in accordance with some embodiments of the present invention.

FIG. 6 shows a cross sectional view of a probe card, modified from the probe card configuration shown in FIG. 3 to include on board components that can be programmed to perform testing in accordance with some embodiments of the present invention. The probe card includes two daughter cards 100. For convenience, components carried over from FIG. 3 to FIG. 6 are similarly labeled. The daughter cards 100 are shown in FIG. 6 as connected by stacked connectors $104_{1-4}$. Although two daughter cards 100 are shown, a single card, more than two cards, or only a PCB without daughter cards 100 can be used to support on-board intelligent circuitry.

As illustrated, the daughter cards 100 can be provided in available spacing between test system controller interface connectors 24. The test system controller (not shown) attached using connectors 24 can limit the height above the connectors 24 within which the daughter cards can be stacked. In the configuration shown, an opening can be provided in the back plate 50, forming an outline area where the daughter cards 100 can be connected to the base PCB 30. The area of the probe card available for daughter cards is generally dictated by the test system controller connection and prober constraints in accordance with some embodiments of the invention. With limited horizontal spacing between test system controller interface connectors 24, board area to accommodate additional circuitry for the architecture in accordance with embodiments of the present invention can be obtained by stacking additional daughter cards 100 within the outline area of the probe card 18. In some alternative embodiments not shown in FIG. 6, the placement of daughter cards is not limited within the periphery defined by the interface connectors 24. In some embodiments, one or more daughter cards can be placed outside the periphery defined by the interface connectors 24.

The stacked connectors $104_{1-4}$ provide spacing for one or more discrete components 114 which can be provided on the surface of each of the base PCB 30 and/or daughter cards 100. The discrete components 114 can include different types of components, for example, one or more bypass capacitors for power supply lines. In some embodiments, these types of discrete components 112 can also or alternatively be provided on the space transformer 34. In some embodiments, the discrete components 112 can be decoupling capacitors. To accommodate the discrete components 112, a number of spring contacts 44 can be removed from the interposer 32, and rerouting of lines provided in the space transformer 34. One or more discrete components 112 such as decoupling capacitors can be placed in close proximity to lines carrying power to probes 16 to increase capacitance on the power lines that affect test results. By being placed in close proximity to where capacitance will improve the decoupling, smaller capacitances can be used for the capacitors.

The daughter cards 100 in some embodiments can include discrete components 114 that can be one or more microcontrollers. Although shown on daughter card 100, similar microcontrollers can be provided on one or more of the daughter cards 100, base PCB 30, and space transformer 34. The microcontroller may be any of a variety of programmable controllers including a microprocessor, sequencer, Field Programmable Gate Array (FPGA), Programmable Logic Device (PLD), Digital Signal Processor (DSP) or other controller or device that can be programmed/configured as a controller for generating and providing test or control signals to electrical circuits. In one embodiment, the microcontroller is the Microchip PIC18FXX20 with A/D capability available from Microchip Technology, Inc. of Chandler, Ariz.

The discrete components 114 on a daughter card 100 or base PCB 30, or discrete components 112 on the space transformer 34 can include one or more memories for use by the microcontroller, or by another processor either on the probe card, or other type of discrete components 112, 114, or components external to the probe card. The memory can be a random access memory (RAM) providing temporary storage, or a device providing more permanent storage such as a flash memory. The memory can also be the configuration memory for an FPGA, or memory device provided on-board the microcontroller. To enable a microcontroller or other processor to perform testing, the memory can be programmed to include test vectors or a test program. Similarly, the memory can include code to generate test signals and interpret test results based on test signals received, as well as provide for test system configuration.

To accommodate the microcontroller (such as microcontroller 110 of FIG. 7) and memory, or other components that can generate heat included as discrete components 114, a temperature control system can be included along with the discrete components 114 on the daughter cards 100, or on the base PCB 30. The temperature control system can include temperature sensors, along with heat sinks, fans, electric coolers, heaters, or other devices needed to maintain component temperatures within a desired range.

Discrete components 112 and 114 can additionally include one or more voltage regulators, DC/DC converters, relays, multiplexers, switches, D/A converters, A/D converters, shift registers, etc. Examples of discrete components 114 according to some embodiments of the invention are shown in the circuit diagrams of FIG. 7 and FIG. 8.

Figure 7:
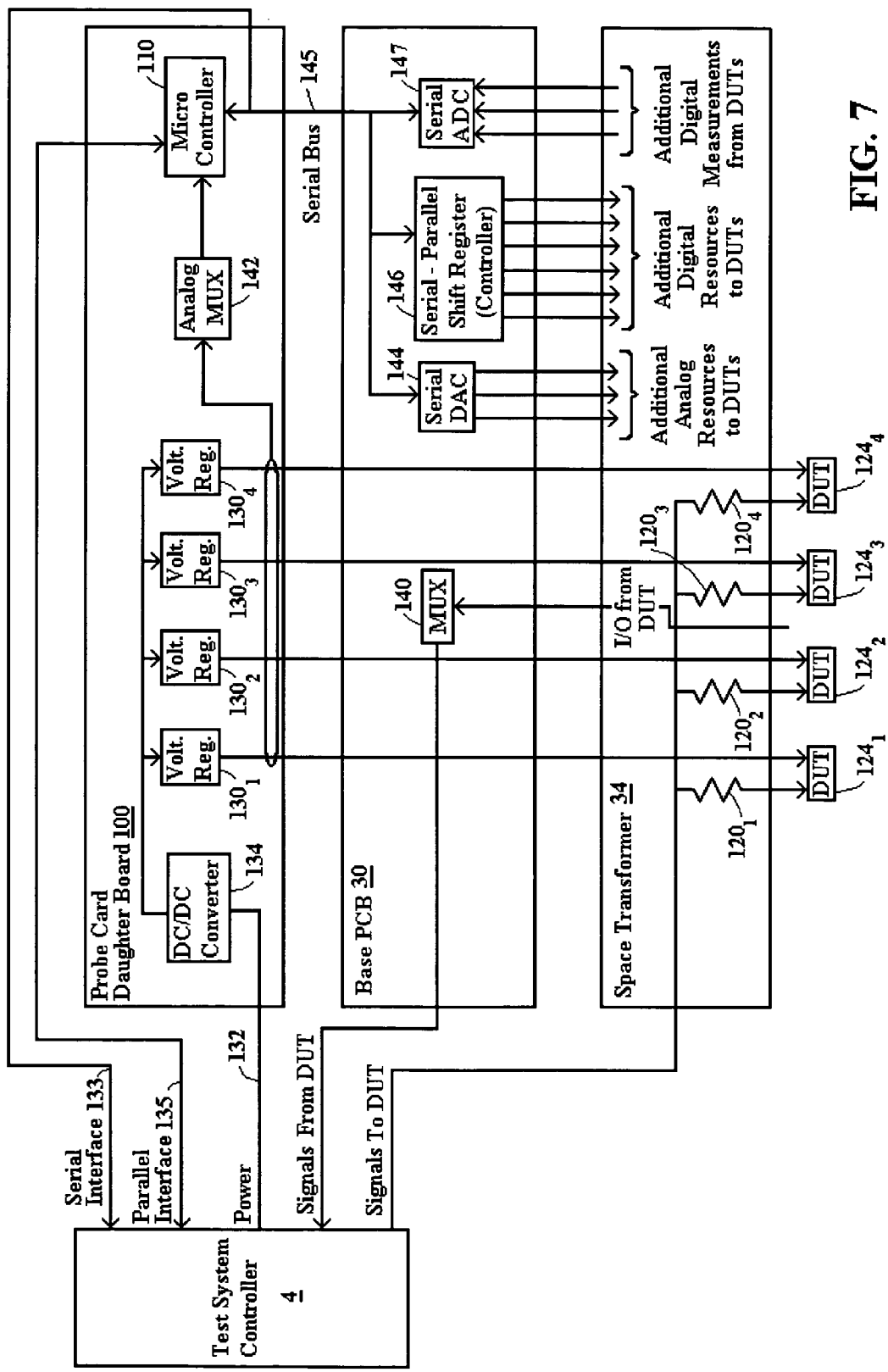
FIG. 7 shows a circuit diagram for components of the probe card of FIG. 6 in accordance with some embodiments of the present invention.

Referring to FIG. 7, some embodiments of the space transformer 34 are shown including thin film resistors $120_{1-4}$ placed in series with each probe to provide an input to respective DUTs $124_{1-4}$. The resistors $120_{1-4}$ in the space transformer 34 are placed in series with an input of each DUT $124_{1-4}$ to aid in isolating failed or shorted DUTs from good DUT inputs. The space transformer 34, illustrated in FIG. 6, can be a multi-layer ceramic substrate, or can be made up of a multi-layer organic substrate, with the thin film material forming resistors $120_{1-4}$ provided on one or more layers in the path of routing lines to the probes. An exemplary DUT isolation resistor is described in U.S. Pat. No. 6,603,323, entitled "Closed-Grid Bus Architecture For Wafer Interconnect Structure" to Miller, et al., issued Aug. 5, 2003.

In further embodiments, as an alternative to series resistors, buffers can be placed in series with each DUT input to isolate failed DUTs, as described in U.S. patent application Ser. No. 10/693,133, entitled "Isolation Buffers With Controlled Equal Time Delay" to Miller, et al., as filed Oct. 23, 2003. Circuitry is then included on the base PCB 30 or daughter card 100 to assure the delay provided in each line having a buffer is uniform, with the circuitry as described in application Ser. No. 10/693,133, referenced previously.

Further details of discrete devices that require programming are described in sections to follow.

A. DUT Power Isolation and Power Control

A system can be limited in the number of DUT power supplies it has available for use. However, if a single power supply is used to drive multiple DUTs, a failed or shorted DUT may affect other, good devices connected to the same test system controller power supply. It can be useful to control the power provided by a power supply driving multiple DUTs since a reduction of power can occur with each channel branch added.

As illustrated in FIG. 7, some embodiments of the present invention use voltage regulators $130_{1-4}$, current limiters or switches in series with each DUT power pin to isolate failed DUTs. Although FIG. 7 shows four voltage regulators, there could be more or less than four. Further, although shown provided from the test system controller 4, power can be provided from separate power supplies through a DC/DC converter 134 to voltage regulators $130_{1-4}$. The voltage regulators $130_{1-4}$ can have power supplied from the test system controller power supply line 132 and distribute power from the power supply line 132 to power multiple DUTs $124_{1-4}$. The voltage regulators $130_{1-4}$ function to isolate failed DUTs from the good DUTs by detecting current surges caused by a DUT with a short, or similar fault, and then cutting off or limiting current to the failed DUT. Although shown as a voltage regulator in FIG. 7, the voltage regulators $130_{1-4}$ can alternatively be switches or current limiters with similar feedback enabling isolation of a failed DUT.

In addition to power supply isolation provided by voltage regulators $130_{1-4}$, some embodiments of the present invention provide for programmable components to increase power from a DUT power supply channel to better enable a single power supply to drive multiple DUTs. In embodiments shown, to increase power, a DC-DC converter 134 can be provided on daughter card 100 between the test system controller 4 and the DUT voltage regulators $130_{1-4}$ to provide additional DUT power. The test system controller 4 has a power supply that typically provides a programmable voltage output with a fixed maximum current. Many DUTs operate at lower voltages than supplied by the test system controller 4. Hence, the test system controller 4 can be programmed to a higher voltage and the DC-DC converter 134 can regulate down to a lower voltage and higher current enabling the power supply of the test system controller to drive more DUTs. If a stand alone PC is used in place of the test system controller 4, it can operate at a lower current reducing wiring carrying negative currents.

To assure a precise voltage is provided to the test system, some embodiments of the present invention provide for calibration and monitoring of the voltage regulators $130_{1-4}$, as well as other probe card components. The microcontroller 110 is shown in FIG. 7 connected to monitor, for example, the output of voltage regulators voltage regulators $130_{1-4}$ to determine when current is cut off due to a DUT failure. In addition to receiving a current signal, the microcontroller 110, or other processor or discrete components of the probe card can be configured to calibrate the voltage regulators $130_{1-4}$. Control signals can then be provided from the microcontroller 110 or other component to control the voltage output through the regulators $130_{1-4}$.

B. Probe Card Self Test

Parallelism in DUT testing can be provided by fan out of test signals in the probe card and portions of test functionality can be moved onto the probe card. Features on the probe card can be provided to insure probe card test function integrity without requiring additional test system controller functionality. In a conventional probe card, the test system controller can generally monitor each channel for integrity. When a single test system controller channel is distributed over branches to multiple DUTs, and components are added in the channel branches to isolate DUTs, probe card integrity checks made by the test system controller designed for the single undistributed channel may no longer be valid checks of the test system.

Accordingly, as shown in FIG. 7, some embodiments of the present invention perform self testing of components on distributed channels as well as probe card components such as the microcontroller 110, serial-parallel register (controller) 146, multiplexers 140 and 142, D/A converter 144, A/D converter 147 and other circuit components of the probe card to assure integrity of the test functions added to the probe card. The modes of operation performed with the microcontroller 110, or processing units on other daughter cards or the base PCB 30 can provide for self test allowing the individual daughter card PCB assemblies and base PCB assembly to be tested.

Control software in a memory of the microcontroller 110 can provide for self testing. Test results can then be reported from the microcontroller 110 to the test system controller 4, or other user interface (not shown) such as a personal computer external to the probe card 18. The microcontroller 110 can also include a programmable mode allowing the probe card to be reconfigured to allow probe card testing using standard probe card test metrology tools. One example of a standard metrology tool which may be used is the probeWoRx system manufactured by Applied Precision Inc. Such a tool may require hardware or software modifications to work in concert with test features placed in the probe card. Use of a probe card with such programmable modes allows self test to be performed while the probe card is installed in a test system in a wafer test environment.

Apart from a self test mode, the microcontroller 110, or other processor of the probe card 18 can include a mode to monitor and report a "health" or performance of the probe card 18 in real time or near-real time. As one example, the microcontroller 110 is shown in FIG. 7 receiving the output of voltage regulators $130_{1-4}$ where the "health" of a DUT is related to whether the DUT has failed. Of course the "health" of a DUT may be related to other parametric information. Circuitry on the probe card to provide for calibration of the regulators $130_{1-4}$, as well as other components of the probe card, can further assure the accuracy of "health" monitoring. The microcontroller 110, or other circuitry on the probe card can likewise be connected to monitor the "health" of DUTs, or to assure the base PCB 30 and daughter card 100 components are functioning properly and report results to the test system controller 4, or other user interface.

In addition to self test and real time or near-real time "health" monitoring, the microcontroller 110, or other processor of the probe card 18 can provide for event logging. Events logged can, for example, include a test history, wafer statistics, pass/fail statistics, DUT site/pin failures, or other data desired when testing using the probe card. Memory included in the microcontroller 110, or separately included on the probe card 18 can be used to store the event log data.

C. Serial Bus Interface

To reduce the amount of routing lines and connector resources needed with use of the daughter cards, a serial bus 145 can be provided in accordance with embodiments of the present invention, as opposed to parallel connections. The microcontroller 110 in FIG. 7 provides a serial bus interface in some embodiments to control the serial bus 145 without additional area overhead. The serial bus 145 of the probe card 18 allows for distribution of the probe card built in self test (BIST) features with less interface wires than a parallel interface.

The serial bus 145 is provided between the daughter card 100 and base PCB 30. Although a single daughter card 100 is shown in FIG. 7, more daughter cards can be used with a serial bus provided between the additional daughter cards, or between the additional daughter cards and the base PCB 30. The serial bus 145 enables communication between the base PCB 30 and daughter cards with less connector and wiring resources than a parallel bus. The serial to parallel converter, such as serial-parallel shift register 146 is provided on the base PCB 30 for distributing the serial bus signals to individual DUTs with less routing lines and connector resources than a completely parallel interface.

Although shown as a simple serial-parallel shift register 146, the serial-parallel shifting device 146 may be a programmable controller such as a processor, DSP, FPGA, PLD, or microcontroller having a basic function of providing parallel to serial conversion. As a processor, the unit 146 can also be configured to perform self test functions, serve to provide programming or data to other processors on the daughter cards, and serve to provide a daisy chained connection of processors through the serial bus 145.

As a processor, the serial/parallel controller unit 146 can further utilize compressed data formats, and can function to compress and decompress data and test vectors. For example, the serial/parallel controller unit 146 can be configured to receive binary coded decimal (BCD) data from components not attached to the serial bus and convert the BCD data to serial data for subsequent distribution. Similar data compression and decompression can be provided by other programmable controllers or processors included on one of the daughter cards 100 or base PCB 30 of the probe card 18.

Similarly, the serial/parallel controller unit 146 configured as a processor can enable the probe card to support scan test features of the DUT. The scan port is typically used in manufacturing to provide for a built in self test (BIST) of the chip, with the scan port not later being connected to a package lead after manufacture. With a connection of a DUT scan port to the serial/parallel controller unit, or other scan test circuitry attached to the serial bus, scan test features of the DUT can be enabled by serial/parallel controller unit 146 either in conjunction with or separate from the test system controller 4.

The serial interface 133 to the test system controller 4 is further shown in FIG. 7. The serial interface 133 is shown as one line but includes multiple wires, providing for serial communication from the test system controller 4 with less wiring and connector resources than a parallel interface. With the serial interface 133, the test system controller 4 can route control signals to the serial to parallel converter 146, or to the microcontroller 110. The serial interface 133 can be provided from the Joint Test Action Group (JTAG) serial port of the test system controller 4 in some embodiments, with a scan register of the test system controller 4 used to provide serial control signals from the test system controller 4.

Although the test system controller 4 is shown to have a serial interface 133 connection with the microcontroller 110, other type communication interfaces can be provided, such as the parallel interface 135 also shown. The additional interfaces can be used either in combination with the serial interface 133, or alone. Other types of interfaces can include RF, wireless, network, IR, or various connections as the test system controller 4 may have available. Although shown connected only to the microcontroller 110, parallel interface 135 can be connected to other devices on the probe card 18 either directly or over a bus.

The serial bus 145 can also be used to distribute analog signals to and from the DUTs. Embodiments of the present invention can include a serial digital to analog (D/A) converter (DAC) 144 to convert serial signals to analog form and distribute the signals to multiple DUTs. The D/A converter 144 receives a test signal input through the serial bus 145 from the serial-parallel shift register 146, although the signal could be provided from other components connected to the serial bus 145. The D/A converter 144 can contain multiple D/A converters per package (typically 8, 16 or 32 per package) that are connected to the serial interface bus 145 for delivering analog voltages to the DUTs with less wiring and PCB area than a parallel interface. An analog to digital (A/D) converter (ADC) 147 can further be included to receive analog signals from the DUTs and convert to a digital form to provide signals over the serial bus. An analog multiplexer (MUX) 142 can further be provided to provide feedback from the outputs of the voltage regulators 13014 to the microcontroller 110 to enable the microcontroller to assure the voltage regulators 13014 are functioning properly for both self test and test integrity assurance.

D. FPGA For Programmable Routing

Figure 8:
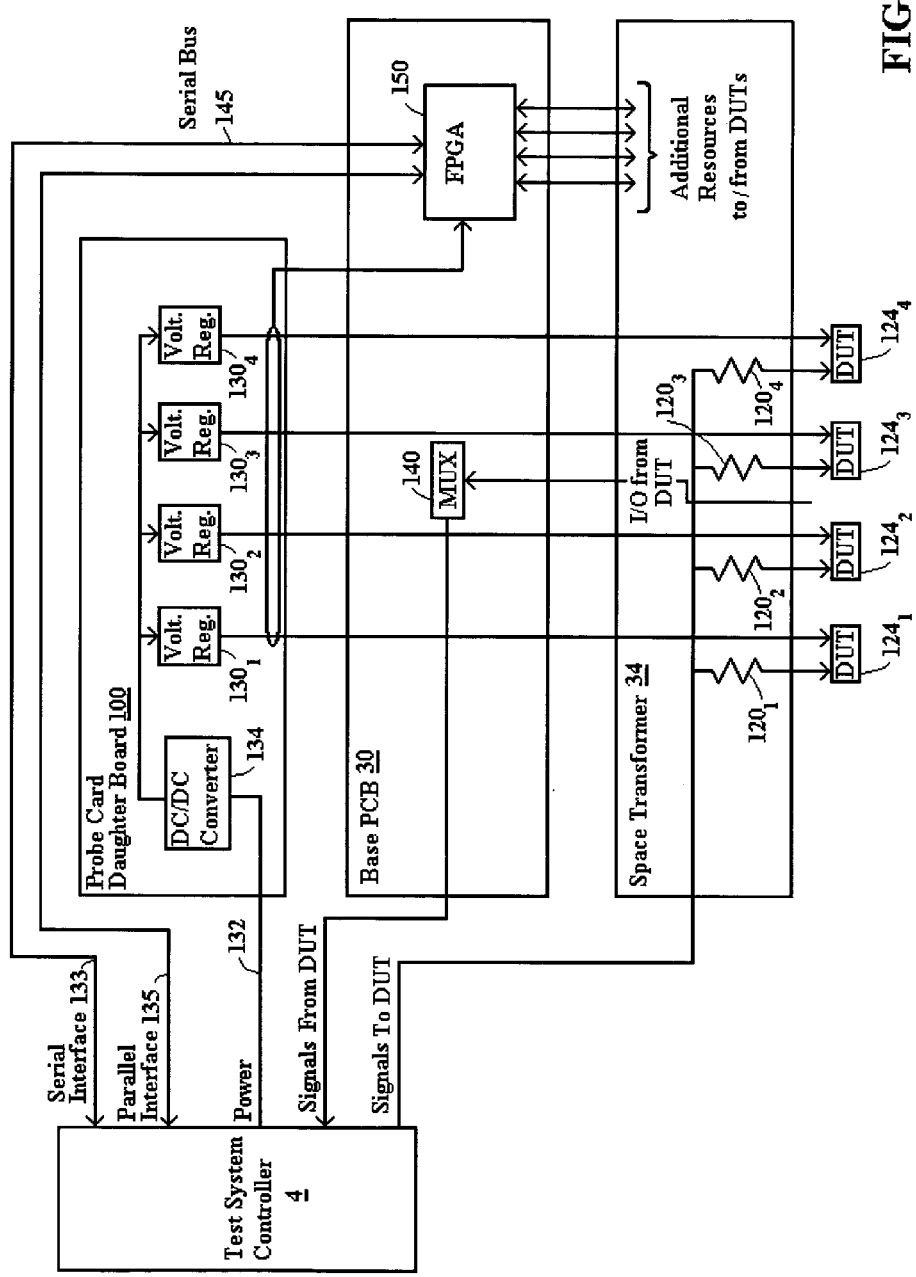
FIG. 8 shows another circuit diagram for components of the probe card of FIG. 6 in accordance with some embodiments of the present invention.

FIG. 8 shows another circuit diagram for components that may be used on the probe card of FIG. 6 according to some embodiments of the invention. The circuit of FIG. 8 modifies FIG. 7 by using an FPGA 150 to replace the serial-parallel shift register 146, the serial DAC 144, and the serial ADC 147 on the base PCB 30. In some embodiments, it replaces less than all three components (for example, any two).

The FPGA 150 can include an on-board microcontroller, or be programmed/configured to provide one or more of the functions of a microcontroller 110, as well as additional functions. The microcontroller 110 of FIG. 7 is, thus, shown removed in FIG. 8 with its function assumed by FPGA 150. Similarly, the FPGA 150 of FIG. 8 can be programmed to perform one or more of the functions of analog multiplexer 142 of FIG. 7, as well as additional functions. The output of voltage regulators $130_{1-4}$ are, thus, shown in FIG. 8 provided to the FPGA 150 and the analog multiplexer 142 of FIG. 7 is removed in FIG. 8. Other components are carried over from FIG. 7 to FIG. 8, and are similarly labeled.

The FPGA 150 can be programmed or configured by a program such as Verilog. Programming or configuration of the FPGA 150 can be provided prior to installation of the FPGA 150 on the probe card 18. Programming or configuration of the FPGA 150 can further be performed after installation using the test system controller 4 or other user interface connected to the probe card 18. The FPGA 150 can be reconfigured, or partially reconfigured on the fly, based on responses from one or more DUTs to facilitate specific tests required for the DUTs. Reconfiguration can allow channels from the test system controller to be reconnected to different probes depending on the DUT response.

The FPGA 150 can be located on the base PCB 150 to reduce the number of routing lines and connectors between a daughter card 100 and the base PCB 30. Alternatively, the FPGA 150 can be included on daughter card 100 or on a separate PCB. The FPGA 150 is shown providing a serial interface to serial bus 145 to provide efficient communications with the serial interface 133 of the test system controller 4, as well as a parallel interface to communicate with the parallel interface 135 of the test system controller 4.

Figure 8A:
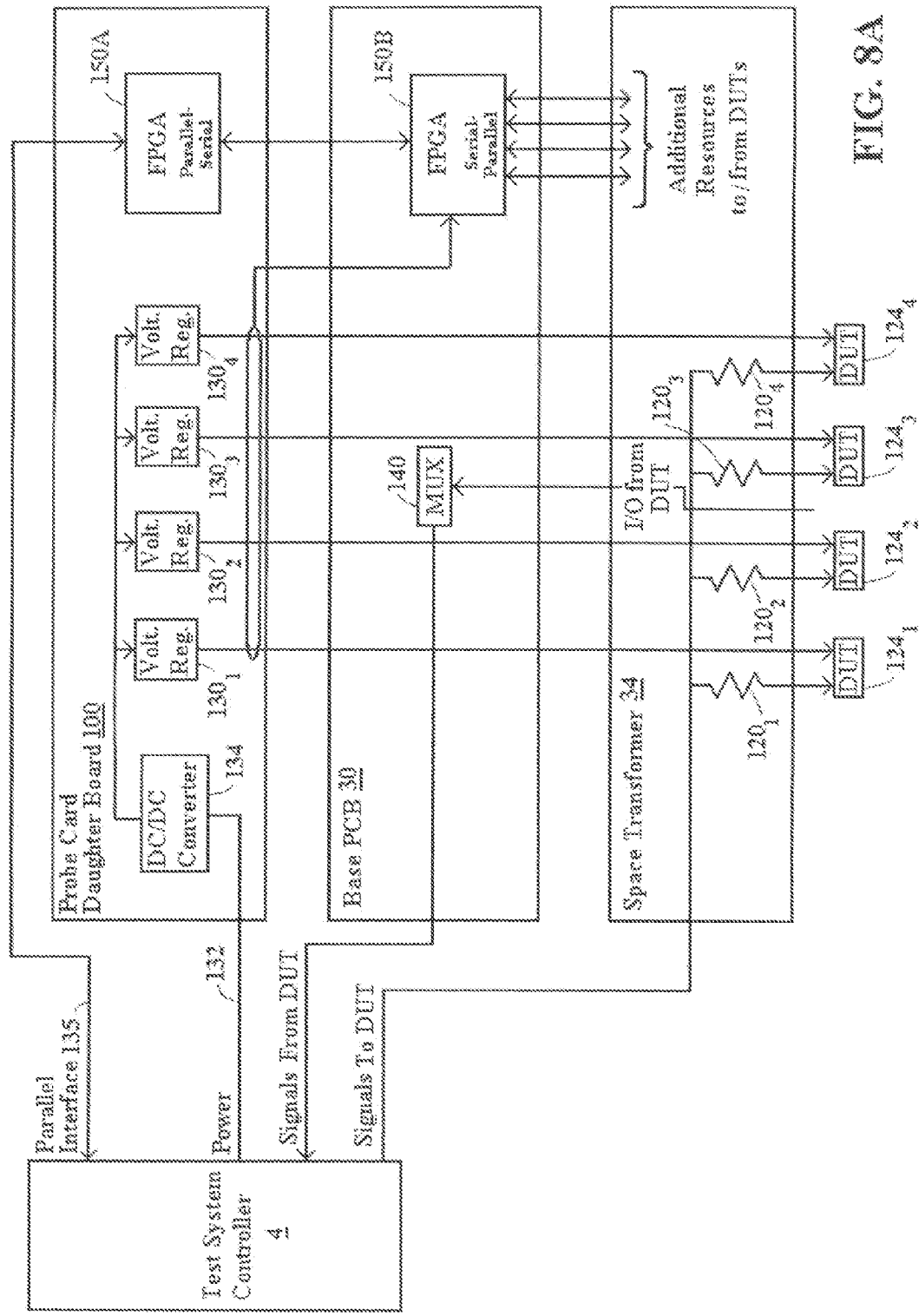
FIG. 8A shows an alternative circuit diagram illustrating a probe card with parallel to serial conversion on a daughter card and conversion back from serial to parallel on the main PCB for distributing to the DUTs in accordance with some embodiments of the present invention.

FIG. 8A shows modifications to the circuit of FIG. 8, illustrating how separate FPGAs 150A and 150B can be provided with some functions moved to a daughter card 100 in accordance with some embodiments of the present invention. For efficient transmission of signals, the FPGA 150A on daughter card 100 are shown receiving signals in parallel over parallel bus 135 and converting the parallel signals to serial for transmission to FPGA 150B on the base PCB 150. The FPGA 150B then converts signals from serial to parallel to transmit to the individual DUTs 124$_{1-4}$. Similarly, signals from the DUTs 124$_{1-4}$ are converted from parallel to serial in FPGA 150B for transmission to FPGA 150A, while FPGA 150A converts the serial data to parallel for transmission back over the parallel interface 135 back to the test system controller 4. Although FPGAs 150A and 150B are shown, it is understood that discrete parallel to serial, and serial to parallel converters can be used. Similarly, although conversion between serial and parallel signals is shown, it is understood that transmission can occur without conversion depending on design requirements.

II. Probe Card Design and Programming

Programming of a microcontroller 110 or FPGA 150 can be based on the design database or test bench of the DUT. In some embodiments, the output of a CAD design system used to develop the DUT may be used to synthesize a test program loaded into the FPGA 150 or microcontroller 110 program memory located on the probe card 18. The CAD design database can be used directly or post-processed by design or CAD tools used to design the probe card. Including the controlling device in a library as part of the CAD design process enables a better prediction of expected test results from the IC and probe card, as well as fabrication and programming of test components.

A. Probe Card and IC Design

Some embodiments of the present invention provide methods for merging a design of the IC to be tested and a probe card 18 with controlling on-board components. Further details of design, manufacture and test of an interactive combined design process is described in U.S. Pat. No. 6,539,531, referenced previously.

In accordance with some embodiments of the present invention, a conventional cell library is expanded to include computational components that can be included on a probe card as probe card component cells in addition to its conventional IC component cells. Such probe card component cells can include, for example, a programmable controller such as an FPGA. The FPGA can be reconfigurable using code stored in a memory to route test signals from various channels to different probes for contacting the ICs to be tested. In some embodiments, the FPGA or other programmable controller can be reprogrammed by code to route signals from a single channel to completely different DUTs being tested. These characteristics of the FPGA or other programmable controller can be included in component cells of a cell library.

With both IC component cells and probe card component cells available in the cell libraries, the CAD tools that design, simulate and verify the internal portions of an IC to be tested can also concurrently develop, simulate and verify the test system. This enables the CAD tools to treat the IC to be tested and the probe card as a unified design, giving them the flexibility to select and arrange system components not only internal to the IC to be tested but also external to the IC to be tested.

As described earlier, FIG. 1 illustrates a process flow of designing, fabricating, testing and interconnecting a conventional IC. Such a process can be modified according to some embodiments of the present invention to include intelligent features of the probe card 18 as described below.

Figure 1:
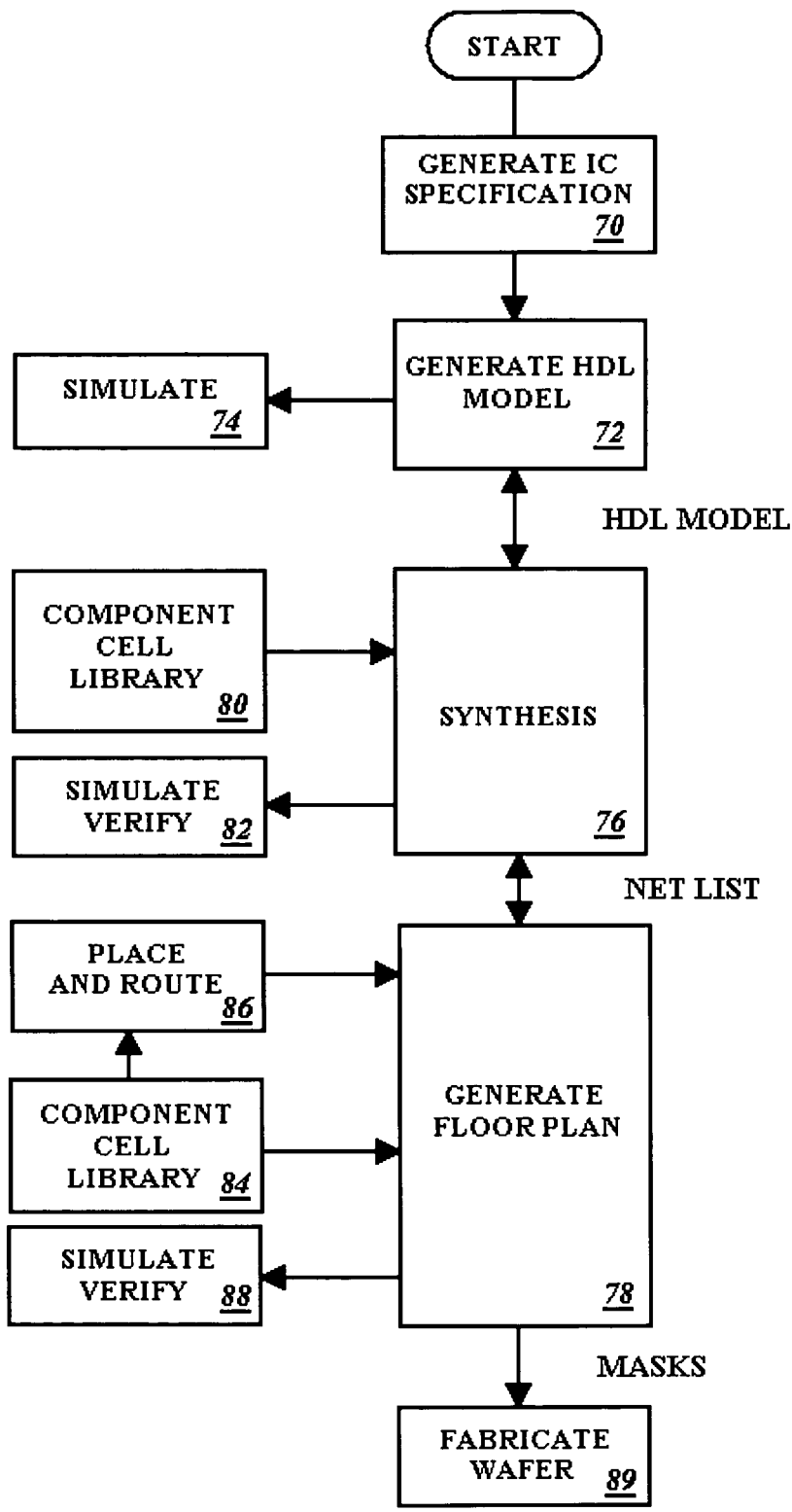
FIG. 1 illustrates a typical prior art process of designing and fabricating an IC on a wafer.

Referring to FIG. 1, a design engineer initially produces a design specification (70) abstractly describing the behavior of the IC and specifying relevant performance criteria and constraints of the IC's internal circuits as well as performance criteria and constraints for each of the IC's I/O, power and ground interconnect systems. The procedure of (70) can be modified in accordance with some embodiments of the present invention to include one or more of the design specifications for intelligent components on the probe card 18, such as an FPGA, a microcontroller 110, and serial to parallel register 146.

The design engineer then uses CAD tools to develop a high-level HDL behavioral model (72) of the IC to be tested, ICs on the probe card and related test components, and employs a circuit simulator (74) to simulate behavior of the circuit logic to generate the HDL behavioral model (72). The design engineer may iteratively adjust and simulate the HDL model until the simulation verifies that the circuit logic behaves as specified. Thereafter, the design engineer employs CAD synthesis tools (76) to convert the high-level HDL behavioral model (72) into a lower-level, technology specific behavioral model of the circuit, such as a netlist. The netlist describes circuit components using behavioral models of probe card component cells and IC to be tested component cells included in a cell library (80). Each netlist component also provides a physical model of the masks (such as photolithographic masks) needed to lay out and interconnect between the probe card component cells and other ICs to be tested component cells. During the synthesis (76), CAD tools not only iteratively design and simulate the logic, they also iteratively design the entire interconnect system between the IC components to be tested and components on the probe card 18.

During the synthesis (76), simulation and verification tools (82) are used to verify that the circuit and interconnect systems described by the netlist model will meet logic and timing specifications. The synthesis (76) may iteratively simulate and alter the IC circuit components to be tested and probe card components used from the component cell library (80) and their interconnect systems to optimize performance. Having verified the logic and timing of the netlist, the netlist is supplied as an input to CAD tools carrying out detailed floorplanning (78). During the floorplanning process (78), placement and routing tools (86) fix locations of component cells (84) within the IC to be tested, including its bond pads. In accordance with some embodiments of the invention, the external portions of each interconnect system in the probe card are also designed in detail during this floor planning process (78). Simulation and verification (88) further assures the IC to be tested and probe card are properly laid out.

With an FPGA 150 used as one of the controlling ICs on a probe card assembly in some embodiments of the present invention, routing and internal configured logic is modeled as part of a CAD layout along with traces in the PCB and any daughter cards leading to and from I/O pins of the FPGA 150. With different probe or contact pitches for DUTs, both the FPGA and traces in the PCB layers can be modified by a designer. In alternative embodiments, with DUT configurations remaining the same for different test environments, it is also possible that the test code or FPGA configuration only would be modified based on CAD data, and that the rest of the circuitry would be largely re-used from a previous design cycle. A single probe card can, thus, be used for multiple test configurations.

An output of the floorplanning process (78) is a description of a set of masks defining ICs on the wafer and the probe card assembly. These masks allow an IC manufacturer to fabricate both the wafer and probe card (89).

B. Programmable Routing

Signal, power and ground traces in a probe card are described previously as being routed with some type of space transformation, either using the space transformer 34 or base PCB 30. Once these traces are manufactured, there is little flexibility in making changes. Flexibility can be built into probe cards by ICs such as relays, switches, or an FPGA to provide controllable rerouting of the traces. Using a programmable or controllable IC to route test signals provides a great degree of flexibility, allowing the same probe card to be used for many designs by simply reprogramming the IC on the probe card. In some embodiments, the ICs of the probe card are controlled or programmed from automatic test equipment attached to the probe card, allowing test engineers to re-program the probe card in real time as they were debugging a test program.

In some embodiments, the FPGA 150, as shown in FIG. 8, is configured to provide programmable test channel routing, allowing selection of different test channel paths to particular probes. The FPGA 150 can function to control routing along with providing a serial-parallel shift function, or function to control trace routing without providing any serial-parallel shifting. Other programmable ICs on the probe card, such as a PLD or simple programmable switches, can similarly be used to provide the programmable trace routing. Programming to set the routing paths of the FPGA can be downloaded into the FPGA's configuration memory from the CAD design software described above.

As described previously with respect to FIG. 6, connectors 24 distribute signals from the test system controller 4 to connectors 24 of the base PCB 30. Channel transmission lines 40 then distribute signals from the connectors 24 horizontally in the PCB 30 for connection to DUTs. In some embodiments of the present invention, such as that shown in FIG. 8, the channel transmission lines 40 of the PCB are routed through the FPGA 150 on the base PCB 30 to enable routing resources of the test system controller 4 to be programmably connectable to different DUTs. The DUTs tested can be provided on a wafer, or DUTs can be tested on individual dies cut out from a wafer. The DUTs testable can include memory devices as well as other components, with non-limiting examples of the memory devices including DRAM, SRAM, SDRAM, MPUs and Flash. The FPGA 150 simply serves as a programmable switch matrix. Resources from the test system controller 4 can be provided either serially or directly to an FPGA 150 on a daughter card, or on the space transformer 34 to enable programmable connection of test system controller resources to different DUTs. Connection to the FPGA 150 either through the test system controller 4, or through a separate connection (not shown) from a user interface such as a personal computer allows the FPGA 150 to be reprogrammed to reconfigure trace routing as desired.

A CAD system can be enhanced by designing the FPGA routing and circuitry along with DUT circuitry. The FPGA routing can reduce components required for testing on the DUT circuitry and move them into the FPGA. Further, with flexible FPGA routing, DUT circuitry can potentially be configured more economically for the DUT with complexity moved into the FPGA of the test system.

A similar system for designing a probe card substrate along with a layout of circuits on a wafer being tested are described in U.S. Pat. No. 6,429,029 entitled "Concurrent Design And Subsequent Partitioning Of Product And Test Die" to Eldridge et al, and U.S. Pat. No. 6,551,844 entitled "Test Assembly Including A Test Die For Testing A Semiconductor Product Die." These patents both describe a CAD system for concurrent design of the product die (on the wafer to be tested) and a test die (layout of a substrate for a probe card space transformer) initially as a unified design. The design methodology then partitions the unified design into the test die and the product die. The product and test die can then be fabricated on separate semiconductor wafers. By later partitioning the product circuitry and test circuitry into separate die, embedded test circuitry can be either eliminated or minimized on the product die. This tends to decrease the size of the product die and decrease the cost of manufacturing the product die while maintaining a high degree of test coverage of the product circuits within the product die. The test die can then be used to test multiple product die on one or more wafers.

According to embodiments of the present invention, a similar procedure described in these patents can be performed to concurrently design a product die and a test die that are later separately manufactured. The present invention simplifies the fabrication of the test die because an FPGA can be programmed, according to the present invention, to provide the routing of the test die and any circuitry needed on the test die. Accordingly, limited fabrication differences will be needed in the actual test die substrate used with the on-board FPGA implementing most of the design differences.

C. Programmable Test Signal Generation and Interpretation of Test Results

In addition to programmable routing, according to some embodiments of the present invention the microcontroller 110 or FPGA 150 on board a probe card 18 can be programmed to generate test signals, and/or to receive test signal returns and provide an interpretation of the test results. Programming can be provided to the probe card 18 in the form of code stored in a memory device on the probe card 18. The memory can be either an on-board memory as part of the microcontroller 110 on a probe card 18, or as a separate memory chip accessible by the microcontroller 110. Code to generate the test vector signals and interpret test data can be generated by the CAD synthesis tools that simulate operation of a test system. The code generated by the CAD design tools can simply be loaded into memory on the probe card 110.

III. Burn-In Tester

Figure 9:
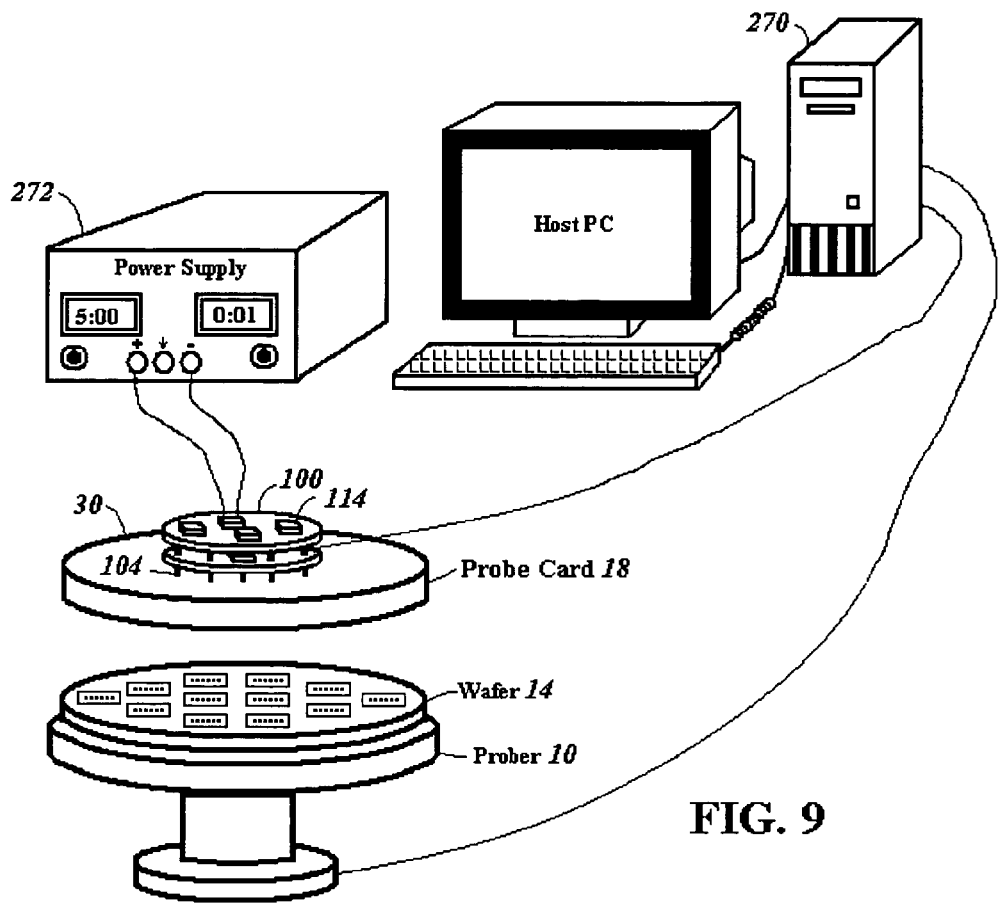
FIG. 9 illustrates a test system setup according to some embodiments of the present invention where testing is substantially reduced to burn-in testing to reduce the test circuit components needed.

FIG. 9 illustrates a test system setup according to some embodiments of the present invention where testing is substantially reduced to burn-in testing to reduce the test circuit components needed. As shown, a personal computer 270 and power supply 272, as opposed to an ATE tester 4 previously described, provide external signals to the probe card 18. Further, the probe card 18 is shown including daughter cards 100 to support circuit elements 114 on board the probe card 18 similar to that illustrated in FIG. 6. Note that although stacked daughter cards 100 are shown, in some embodiments the circuit elements 100 may be provided on a main PCB 30 of the probe card 18.

With the components of FIG. 9, features that can be provided using different embodiments of the present invention include: (1) controlling test circuitry included on the probe card 18, (2) limited test channel pads per wafer 14 when testing flash or non-volatile memory, and (3) no receive signal processing needed when burn-in only testing is desired, allowing the personal computer 270 and power supply 272 to be used with less circuitry to provide power and control signals than a more complex ATE tester. The components of FIG. 9 allow for burn-in of DUTs on a wafer 14, although it is contemplated that the wafer can be at least partially diced up into separate die carrying the DUTs, or completely diced up and the dies held together (prior to installing in a package or device) in a fixture for testing using the prober 10 as a support and the test components of FIG. 9 described herein. It is also contemplated that in addition to burn-in testing, more complex testing can be performed with the configuration of FIG. 9 with additional wiring and test components.

Figure 10:
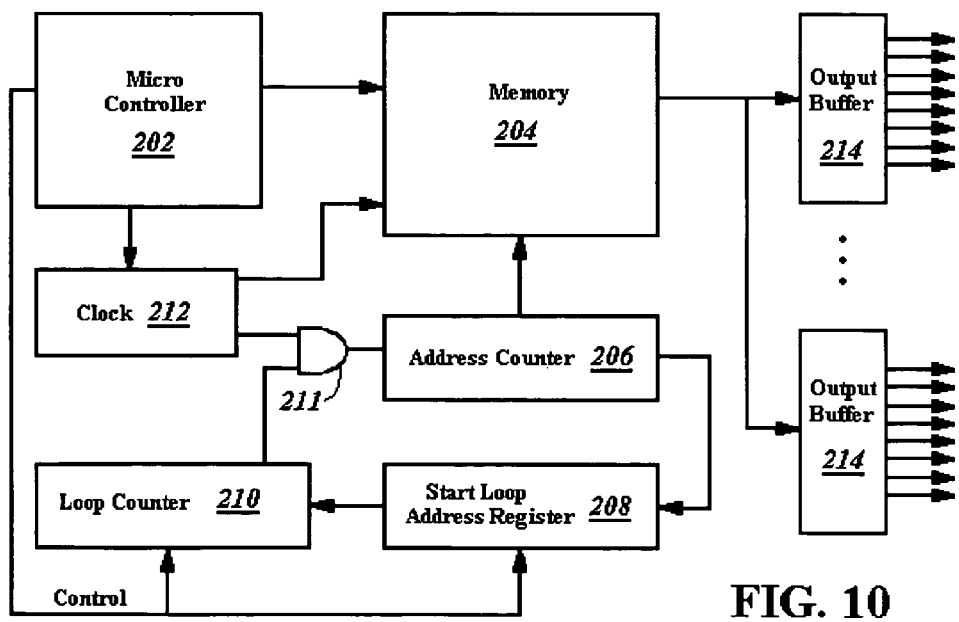
FIG. 10 shows embodiments of circuitry that can be included on the probe card of FIG. 9 to perform burn-in testing of non-volatile memory.

FIG. 10 shows embodiments of circuitry that can be included on the probe card of FIG. 9 to perform burn-in testing of non-volatile memory. As shown, the circuitry includes a microcontroller 202, memory 204, an address counter 206, a start loop count register 208, a loop counter 210, a clock 212 and buffers 214. The system is controlled by microcontroller 202, which may be one of a variety of programmable control devices including a microprocessor, a digital signal processor, or a sequencer. The memory 204 stores programming states for transmitting through buffers 214 to program different values into the non-volatile memory devices of DUTs and subsequently erase the non-volatile memory devices to provide for burn-in testing. Outputs of the memory 204 are provided from the buffers 214 through channels of the probe card to resilient contacts to connect to pads of the individual DUTs on a wafer.

To provide the sequence of programming states, the microcontroller 202 provides control signals to set the clock 212, and then to start loop address register 208 and loop counter 210 to start a sequence of addresses flowing from address counter 206. The clock 212 and loop counter 210 provide signals through an AND gate 211 to address counter 206 to sequentially count through the memory addresses of memory 204. As each location of memory 204 is addressed, the microcontroller 202 provides appropriate programming and erase signals addressed to individual memory cells of the non-volatile memory array 204. The memory 204 can have vectors or a test program stored to control program and erase operations as written by the microcontroller 202. An external connection can likewise be provided to the microcontroller 202, such as from a personal computer 270 shown in FIG. 9, to provide test vectors for altering the contents of the memory 204. In some embodiments, the microcontroller 202 provides test status information through an interface to a display on the external user interface such as the personal computer 270 shown in FIG. 9.

For the embodiments illustrated in FIG. 10, an output buffer 214 is provided to supply signals to each DUT, so that all DUTs on a wafer can be set up in parallel with no wait states. In some embodiments, at least one pin is provided to monitor a ready/busy state from a DUT to temporarily halt some programming operations. With burn-in testing only providing transmit signals, if a DUT is in a busy state after timeout, testing will continue. Further, with no read states, program verification cycle times are not required. Further, although only eight control outputs are shown provided per DUT from each output buffer 214, this number may vary, illustrating that a minimal number of control pins are typically used on a non-volatile memory device (particularly flash memory) that has serial inputs. Only one or two power supply inputs per DUT for a flash memory are typically required, along with only a single ground connect line for all the DUTs on a wafer. Operation of the circuitry of FIG. 10 is further simplified, with only an initialization step and then a loop to supply addresses to memory 204.

Although the components of FIG. 10 are shown configured to transmit signals to program and erase memory cells of a non-volatile memory, in some embodiments components can be included to receive or read the state of the non-volatile memory to perform additional tests. To read signals, additional read buffers can be used that are enabled, while output buffers 214 are disabled, with the output of additional read buffers connected by channels to an external tester or personal computer. The test signals can likewise be directed from the additional read buffers to a microcontroller, with the microcontroller processing the signals and providing test results to an external user display, such as on the personal computer display shown in FIG. 9.

In other embodiments, one or more of the components of FIG. 10 can be programmed into a Field Programmable Gate Array (FPGA) or other Programmable Logic Device (PLD) provided on the probe card. The microcontroller 202 as well as memory 204 can be included as on-board elements of the FPGA. Also, with systems using components not shown in FIG. 10, such as a system that provides for reading from a memory device, it is understood that the additional components can be programmed into the FPGA, or other PLD.

The burn-in only test system according to some embodiments of the present invention is particularly configured for flash memory and supplies high voltages and currents on test channels to enable programming and erase operations for the non-volatile flash memory. With non-volatile or flash memory where larger transistor sizes are used to form the non-volatile memory cells, a larger spacing is provided between DUT pads in an array. Larger spacing between DUT pads further exists because non-volatile memory typically uses serial interface connections. The larger spacing and limited circuitry for burn in testing enables a test system according to embodiments of the present invention to test all DUTs on a wafer in a single touch down. Multiple probe cards used for flash memory burn in testing can be likewise controlled using a single personal computer.

With an FPGA used on a probe card, along with an external personal computer interfacing with the FPGA as shown in FIGS. 9-10, test functions are divided between these components for efficient operation as described generally previously. Test functions performed by the FPGA, or local card controller, include—test sequence control; test vector generation; reporting of test results; and diagnostic self test of the functionality of components on the probe card. If receive capabilities are provided, an FPGA or local card controller can function to disable non-functional DUTs by disconnecting power or sending a disable/not-ready signal. Test functions performed by a personal computer can include—downloading diagnostic, test sequence and pattern information needed for testing particular DUT configurations to an FPGA or controller on a probe card; collecting and reporting test information from an FPGA or controller; and providing an interface with the probe card components, prober, and power supplies. In some embodiments, a touch down detector is provided on each spring probe of the probe card, and monitored by the personal computer to control movement of the prober.

Figure 11:
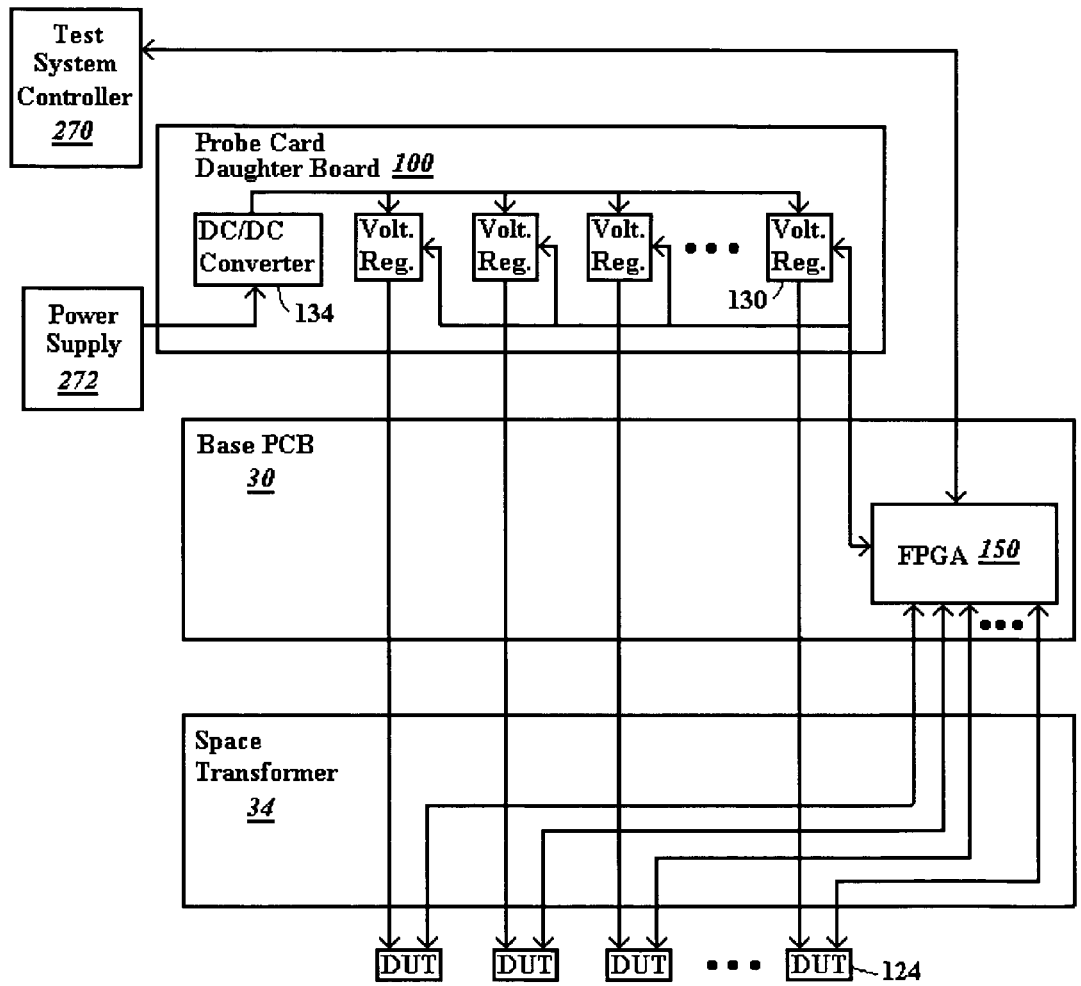
FIG. 11 shows embodiments of the present invention with an FPGA providing the function of components described with respect to FIG. 10 for testing of non-volatile memory elements along with interfacing to a test controller and power supply.

FIG. 11 illustrates embodiments of the present invention with an FPGA 150 providing the function of components described with respect to FIG. 10 for testing of non-volatile memory elements along with interfacing to a test controller 270 and power supply 272. The circuitry of FIG. 11 further illustrates power supply circuit components on the probe card for providing power to DUTs 124 from the power supply 272 enabling limited power supply components to be used external to the probe card. With power supply control components and an FPGA 150 included directly on a probe card, power can be provided from a simple power supply 272 and control can be provided from a simple test controller 270, as illustrated in FIG. 9, rather than use of a complex power source such as in an ATE tester.

The added power control circuitry shown in FIG. 11 serves to receive power from a simple power supply, and distribute the power to DUTs 124 while isolating failed or shorted DUTs to prevent them from affecting the other good devices connected to a common power supply unit 272. To isolate failed power supplies in FIG. 11, voltage regulators 130 are provided in series with each DUT power pin. The voltage regulators 130 have power supplied from power supply 272 and distribute the signal to multiple DUTs 124. The voltage regulators 130 function to isolate failed DUTs from the good DUTs operating from the same voltage source by detecting current surges caused by a DUT with a short, or similar fault, and then cutting off or limiting current to the failed DUT. Although shown as voltage regulators 130 in FIG. 11, the voltage regulators 130 can be replaced by switches or current limiters with similar feedback enabling isolation of a failed DUT.

In addition to isolation of a power supply line from failed DUTs in FIG. 11, power supply control can be further provided to prevent a reduction of power from a single supply 272. In embodiments shown, to increase power, a DC/DC converter 134 can be provided on daughter card 100 to provide additional DUT power. The power supply 272 can have a programmable voltage output with a fixed maximum current. Many DUTs may operate at lower voltages than are supplied by power supply 272. In that case, the test system controller can be programmed to a higher voltage and the DC/DC converter 134 can regulate down to a lower voltage and higher current enabling the power supply 272 to drive more DUTs. Control signals can then be provided to and from the FPGA 150 to control the voltage output through the regulators 130, as illustrated.

To accommodate power supply control components such as DC/DC converter 134 and voltage regulators 130 and other heat generating elements used on the probe card, or components that may overheat when heat is supplied for burn-in testing, discrete components included on the probe card can be provided to reduce temperature and provide a temperature control system on the daughter cards 100, or on the base PCB 30. The temperature control system can include temperature sensors, along with heat sinks, fans, electric coolers, heaters, or other devices needed to maintain component temperatures within a desired range.

The FPGA 150 as shown in FIG. 11 can provide program and erase signals to pads of the DUT. Programming or configuration of the FPGA 150 can be provided prior to installation of the FPGA 150 on the probe card. Programming or configuration of the FPGA 150 can further be performed after installation using the test system controller 270 connected to the probe card. The FPGA 150 can be reconfigured based on responses from one or more DUTs to facilitate specific tests required for the DUTs. The FPGA can be customized by software for testing specific DUT designs. In some embodiments, the FPGA is controlled or programmed from automatic test equipment attached to the probe card, allowing test engineers to re-program the probe card in real time as they were debugging a test program. In other embodiments, the FPGA may be re-programmed "on the fly" in response to data received during the test process. The FPGA 150 can likewise be programmed using CAD software as described previously.

The FPGA 150 can be located on the base PCB 30 rather than on daughter cards 100 to reduce the number of routing lines and connectors between daughter cards 100 and the base PCB 30, although it is conceivable the FPGA 150 could be included on one of the daughter cards 100. The FPGA 150 is shown providing an interface to enable efficient communications with the test system controller 270 to configure the FPGA to function with different DUT configurations and to provide test results to an external personal computer.

The components shown in FIG. 11 can be located on any of the probe card PCBs that may be required. Power supplies may be located on the same PCBs as programmable controllers or other ICs on the probe card. Also, depending on design requirements, the FPGA 150 may be configured to act as the power supply, with no other separate power delivery components required.

Although embodiments of the present invention are described for testing memory devices such as flash, DRAM or SRAM, it is contemplated that embodiments can likewise be provided for burn-in testing of non-memory devices such as microprocessor units (MPUs), or programmable logic devices (PLDs). A sequence of operations or instructions can be written to DUTs on a wafer, such as MPUs or PLDs using a probe card and user interface, as shown configured in FIG. 9, to allow burn-in testing. Further, with a limited number of DUTs per wafer, additional signals can be provided for reading memory cell states using a general user interface or personal computer rather than a more complex ATE tester device. Reading may be easily accommodated beyond burn-in with less wiring and components than are required for both reading and writing. This may require a series of high speed interfaces be implemented on the DUTs.

Figure 12:
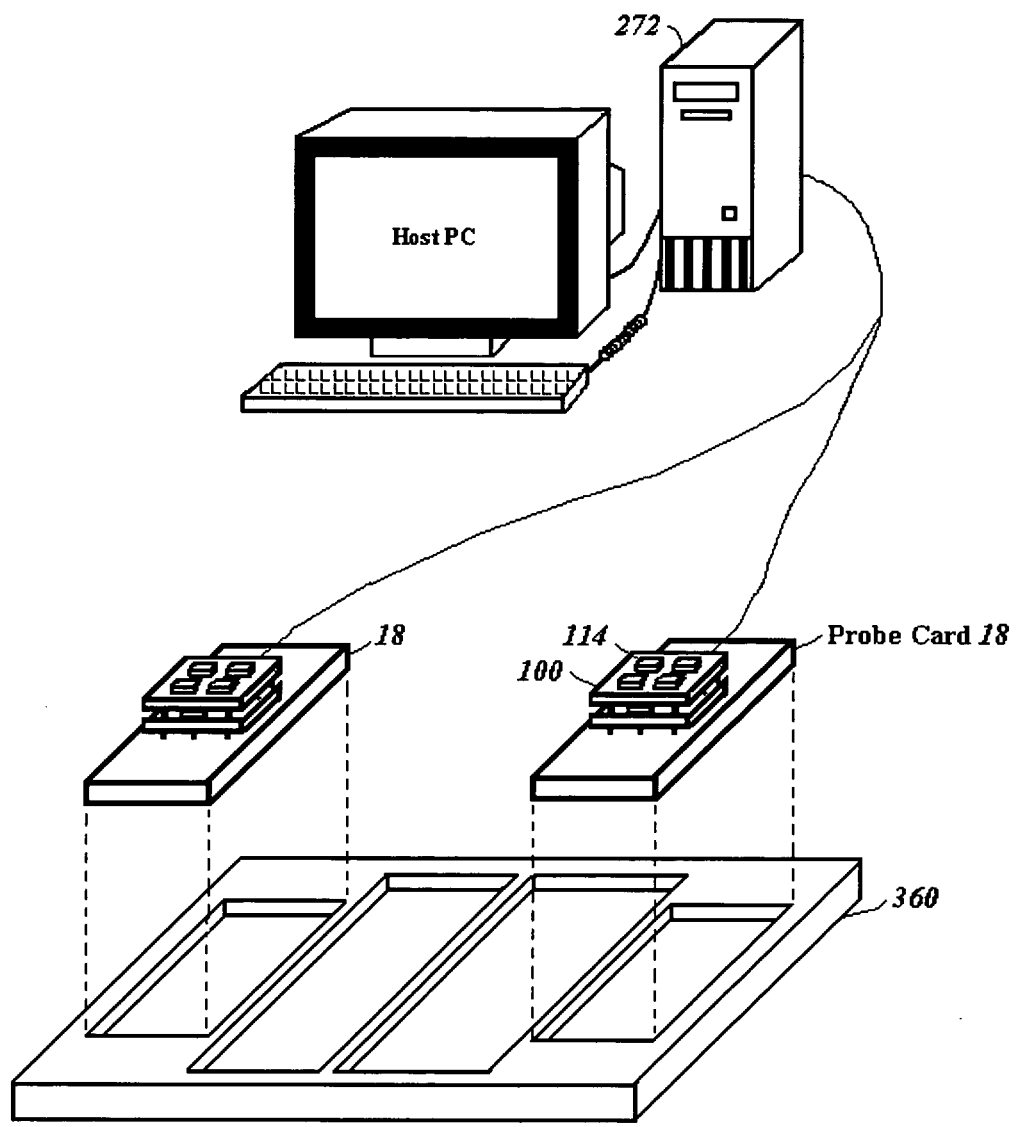
FIG. 12 illustrates further embodiments of the present invention, where a number of probe cards are connectable together in a frame to form a single prober.

FIG. 12 illustrates further embodiments of the present invention, where a number of probe cards 18 are connectable together in a frame 360 to form a single prober. FIG. 12 illustrates that the probe cards can be rectangular, or any of a variety of shapes, as opposed to the round shape of FIG. 5. The fixture 360 enables the probe cards 18 to be inserted like cassettes. If a wafer being tested is relatively small, only a single probe card 18 will be needed, but if larger wafers are tested, additional probe cards can be inserted into a frame 360 to form a prober that can still test all DUTs on the larger wafer or contact region in a single touch down. As further illustrated in FIG. 12, all probe cards 18 in the frame 360 can be connected to a single personal computer 270, although multiple computers 270 or a more complex ATE tester are contemplated if significant processing is required. As in FIG. 9, the probe cards 18 are shown in FIG. 12 with attached daughter cards 100 supporting components 114, although daughter cards may be eliminated depending on design requirements. A probe card assembly made according to some embodiments of the present invention can further be used to test DUTs that have been diced up from a wafer and reassembled as individual dies or dies places in carriers, such as described in application Ser. No. 10/177/367, filed Jun. 19, 2002, entitled "Test Method for Yielding a Known Good Die," by Miller, et al.

Figure 2:
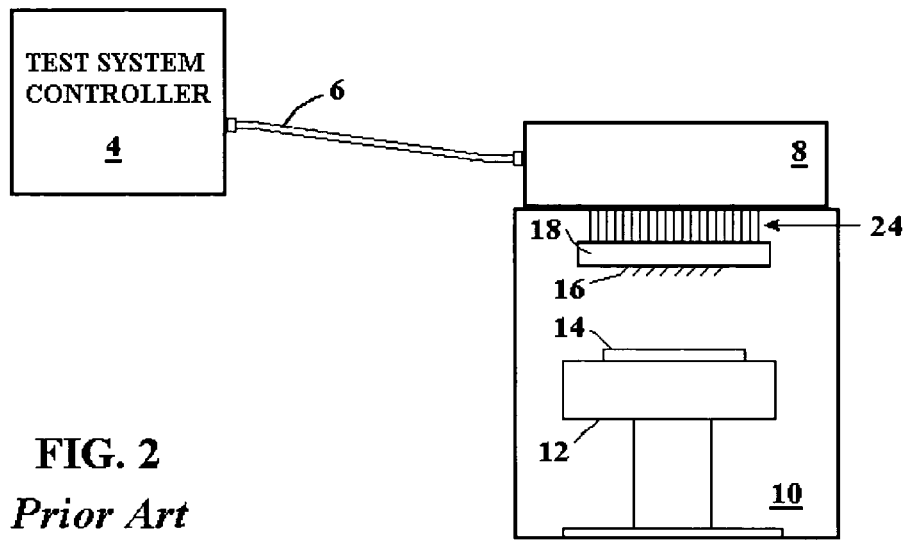
FIG. 2 shows a block diagram of a typical test system using a probe card for testing devices under test (DUTs) on a semiconductor wafer.

A test system according to some embodiments of the present invention shown in FIG. 2 or previous figures can further be used for burn-in testing, including burn-in testing of volatile memory devices where a number of cycles of programming and erasing of memory cells can be performed using the test system with operation temperature varied to simulate extreme or worst case operating conditions. After burn-in testing, further tests can then be performed to disconnect rows of memory cells that include faulty memory cells before dicing a wafer up into individual chips. As another alternative, DUTs that fail further testing after burn-in can be discarded after dicing up the wafer, avoiding the packaging costs for failed DUT dies.

Although embodiments of the present invention have been described above with particularity, this was merely to teach one of ordinary skill in the art how to make and use the embodiments. For example, although described as individual features herein, the embodiments of the present invention described can be used either individually, or combined as test requirements may dictate. Many additional modifications will fall within the scope of the invention, as that scope is defined by the following claims.

What is claimed is:

1. A method of programming a probe card comprising channel connectors to an external tester configured to control testing of integrated circuits (ICs), the probe card further comprising probes for contacting the ICs, the method comprising:
    while the probe card is connected through the channel connectors to the external tester, which is external to the probe card, providing a connection code from a source external to the probe card to a memory on the probe card, the connection code specifying a particular pattern of connections of the channel connectors to the probes;
    while the probe card is connected through the channel connectors to the external tester, providing the connection code from the memory on the probe card to a programmable controller on the probe card, wherein inputs of the programmable controller are connected to the channel connectors and outputs of the programmable controller are connected to the probes, the programmable controller being programmable to connect selectively the inputs and the outputs in different patterns; and
    while the probe card is connected through the channel connectors to the external tester, in response to the connection code in the memory, the programmable controller selectively establishing within itself a pattern of connections between the inputs and the outputs of the programmable controller that corresponds to the particular pattern specified by the connection code in the memory, wherein the programmable controller selectively connects the channel connectors to the probes in the particular pattern specified by the connection code in the memory,
    wherein the programmable controller comprises a programmable switch matrix, the method further comprising partially reconfiguring the programmable switch matrix during testing of the ICs.

2. The method of claim 1, wherein the programmable switch matrix comprises a Field Programmable Gate Array (FPGA).

3. The method of claim 1, wherein the programmable switch matrix comprises at least one of a field programmable gate array (FPGA), a digital signal processor (DSP), and a microprocessor.

4. A method of claim 1 wherein the programmable controller is provided on a daughter card attached to a main PCB of the probe card, the programmable controller providing test signals in a serial manner from the daughter card to the main PCB, the method further comprising:
    converting the test signals received from the programmable controller from serial to parallel on the main PCB; and
    distributing the test signals to the probes.

5. The method of claim 1, wherein at least part of the connection code is derived from a Computer Aided Design (CAD) system.

6. The method of claim 1, wherein:
    the ICs comprise memory devices; and
    the programmable controller is further configured to send program and erase voltages to provide the signals for burn-in to the ICs.

7. The method of claim 6, wherein the probe card is configured to only transmit the signals to provide for the burn-in.

8. The method of claim 6, wherein serial test signals are provided to at least one serial port of each of the DUTs.

9. The method of claim 6, wherein the ICs comprise at least one of DRAM, SRAM, SDRAM, MPUs and Flash.

10. The method of claim 1, wherein the programmable switch matrix selectively changes interconnections between ones of the channel connections and ones of the probes in accordance with a change of the connection code.

11. The method of claim 1, wherein the testing comprises the external tester generating test signals, which are provided through the channels to the probe card.

12. The method of claim 11, wherein the testing further comprises the programmable controller controlling provision of the test signals from the channel connectors through the probe card to the probes.

* * * * *